United States Patent [19]

Stevens

[11] 4,142,405
[45] Mar. 6, 1979

[54] STRAIN GAUGE ARRANGEMENTS

[76] Inventor: Robin T. A. Stevens, C.I.L. Electronics Limited, Timberlaine Trading Estate Decoy Rd., Worthing, West Sussex, England, BN14 8ND

[21] Appl. No.: 844,923

[22] Filed: Oct. 25, 1977

[30] Foreign Application Priority Data

Oct. 27, 1976 [GB] United Kingdom ............... 44573/76

[51] Int. Cl.² ................................................ G01B 7/16
[52] U.S. Cl. ...................................................... 73/763
[58] Field of Search ................... 73/88.5 R, 88.5 SD; 324/105; 323/75 N

[56] References Cited

U.S. PATENT DOCUMENTS

| 3,841,150 | 10/1974 | Pearson | 73/88.5 R |
| 3,847,017 | 11/1974 | Watts | 73/88.5 R |
| 3,859,594 | 1/1975 | Grindheim | 73/88.5 R |

Primary Examiner—Anthony V. Ciarlante
Attorney, Agent, or Firm—Eyre, Mann, Lucas & Just

[57] ABSTRACT

An electronic d.c. amplifier arrangement for use with a bridge network incorporating at least one sensing element, the supply to said bridge being effected via respective differential amplifiers, one of which is connected to compensate for the length of line between the arrangement and the bridge network, and the other effects automatic zero-compensation, while a further differential amplifier of adjustable gain provides an amplified output from said bridge network.

3 Claims, 1 Drawing Figure

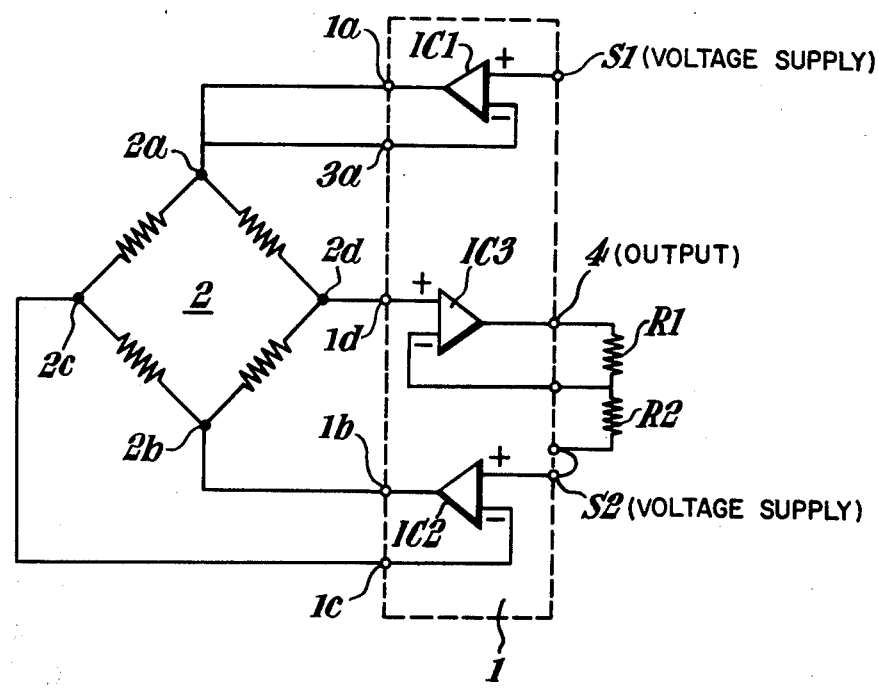

STRAIN GAUGE ARRANGEMENTS

The invention relates to electronic d.c. amplifier arrangements for producing a precise output voltage in dependence upon the unbalance of a measuring bridge whilst eliminating the adverse effects of thermal instability external influences such as line length or noise, such as may be experienced with measuring instruments using measuring bridge networks, for example in temperature sensing, or strain gauge measuring applications.

One object of the invention is to provide d.c. amplifier arrangements capable of producing a reliable output characteristic substantially independent of ambient temperature or long term drift and also providing automatic lead length compensation and common mode errror rejection with autozeroing action, as will be explained hereinafter.

The invention consists in an electronic d.c. amplifier arrangement in which the output of a first differential amplifier is connected to one bridge supply terminal, the output of a second differential amplifier is connected to a second bridge supply terminal, respective bridge operating supply voltage terminals being connected to the positive inputs of said first and said second differential amplifiers, the negative input of said first differential amplifier being connected to a compensating terminal for a return connection to be provided from the point of connection of a bridge to the connecting conductor from said one bridge supply terminal, the negative input of said second differential amplifier being connected to a negative bridge response input terminal, and a positive bridge response terminal being provided for connection to the output of said bridge diagonally opposite to that connected to said negative response input terminal, said positive bridge response terminal being connected to the positive input of a third differential amplifier whose output is connected to an output terminal of said arrangement and whose negative input is connected to a terminal to provide for a connection to a tapping of a potential divider chain when the latter is connected between said output terminal and said second bridge operating supply voltage terminal.

An arrangement constructed in accordance with the invention can be used with resistive bridge networks having in at least one arm thereof a load cell, pressure transducer, torque transducer or other form of strain gauge or sensor for measuring shock or vibration. An isolation of the bridge supply or the use of a.c. coupling or opto-electronic devices is not necessary to ensure reliability and elimination of errors. The output may be connected to any suitable indicator, such as a digital voltmeter, and test means may be provided to inject d.c. or a.c. calibrating and performance analysis signals. The arrangement may have a broad band response, e.g. up to 1 MHz and 100 db d.c. open loop voltage gain.

The invention will now be described with reference to the drawing, which schematically illustrates one exemplary embodiment.

The drawing shows the block schematic circuit of an amplifier arrangement 1 having connected a strain gauge resistive bridge network 2. The bridge incorporates at least one sensing element but two or four elements may be connected to act in opposition and increase the sensitivity. Terminal 2a of the bridge is connected to a positive bridge supply terminal 1a of the arrangement 1. Terminal 2b of the bridge is connected to a negative bridge supply terminal 1b.

To provide an operating potential between the bridge terminals 2a and 2b, the arrangement terminals 1a and 1b are connected to the outputs of respective differential amplifiers IC1 and IC2, each of which has its positive (or non-inverting) input supplied via a respective terminal S1 and S2 from a supply source (not shown).

In order to provide automatic compensation for any impedance introduced by the length of connecting cable that may be required between the arrangement and the bridge, a return path is provided by a conductor from the bridge terminal 2a to a compensation input terminal 3a, which is connected to the negative or inverting input of the amplifier IC1.

To avoid common mode errors and effect automatic zero-correction there is a connection provided from one output terminal 2c of the bridge to an associated negative bridge response input terminal 1c of the arrangement which drives the negative input of the amplifier IC2, in order to control the potential at the terminal 2b so that the voltage at 2c is held at zero, i.e. an auto-zero technique is employed.

The output connection 2d from the bridge is connected to a positive bridge response terminal 1d, which drives the positive input of a third differential amplifier IC3 whose output is connected to an output terminal 4 of the arrangement to which may be connected a display or analysis device, computer or other test and control equipment. Also connected to the terminal 4 there is a potential divider chain formed by the series connection of two resistors R1 and R2, whose other terminal connection is taken to the terminal S2. The junction of the resistors R1 and R2 is connected to the inverting input of the amplifier IC3, so that the gain of the amplifier IC3 can be preselected, as the ratio R1/R2 determines the gain.

It will be readily apparent that the individual paths may include additional amplifier or buffer stages, and devices such as opto-electronic isolators may be used in the output path where the circumstances make the use of such devices desirable.

What I claim as my invention and desire to secure by Letters Patent of the United States is:

1. An electronic d.c. amplifier arrangement in which the output of a first differential amplifier is connected to one bridge supply terminal, the output of a second differential amplifier is connected to a second bridge supply terminal, respective bridge operating supply voltage terminals being connected to the positive inputs of said first and said second differential amplifiers, the negative input of said first differential amplifier being connected to a compensating terminal for a return connection to be provided from the point of connection of a bridge to the connecting conductor from said one bridge supply terminal, the negative input of said second differential amplifier being connected to a negative bridge response input terminal, and a positive bridge response terminal being provided for connection to the output of said bridge diagonally opposite to that connected to said negative response input terminal, said positive bridge response terminal being connected to the positive input of a third differential amplifier whose output is connected to an output terminal of said arrangement and whose negative input is connected to a terminal to provide for a connection to a tapping of a potential divider chain when the latter is connected between said output terminal and said second bridge operating supply voltage terminal.

2. An arrangement as claimed in claim 1, in which said bridge supply terminals, said compensating terminal and said bridge response terminals are connected in the manner set out to a resistive bridge network which incorporates at least one sensing element.

3. An arrangement as claimed in claim 2, in which said sensing element is a strain gauge element.

* * * * *